(12) United States Patent
Yadav et al.

(10) Patent No.: US 12,244,138 B2
(45) Date of Patent: Mar. 4, 2025

(54) FULLY DIFFERENTIAL ESD CIRCUIT FOR HIGH-FREQUENCY APPLICATIONS

(71) Applicant: QUALCOMM Incorporated, San Diego, CA (US)

(72) Inventors: Kshitij Yadav, San Diego, CA (US); Vijayakumar Dhanasekaran, San Diego, CA (US); Khaled Mahmoud Abdelfattah Aly, Irvine, CA (US); Ramkumar Sivakumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 283 days.

(21) Appl. No.: 18/070,386

(22) Filed: Nov. 28, 2022

(65) Prior Publication Data

US 2024/0178662 A1    May 30, 2024

(51) Int. Cl.
*H02H 9/04* (2006.01)
(52) U.S. Cl.
CPC .................................. *H02H 9/046* (2013.01)
(58) Field of Classification Search
CPC ............................ H02H 9/046; H01L 27/0255
USPC ......................................................... 361/56
See application file for complete search history.

(56) References Cited

U.S. PATENT DOCUMENTS

| | | | |
|---|---|---|---|
| 10,809,787 B2 * | 10/2020 | Nayak | G06F 1/266 |
| 2004/0252426 A1 | 12/2004 | Hargrove et al. | |
| 2011/0176245 A1 * | 7/2011 | Worley | H03F 1/52 |
| | | | 361/56 |
| 2012/0236444 A1 | 9/2012 | Srivastava et al. | |
| 2016/0336744 A1 * | 11/2016 | Parthasarathy | H02H 9/046 |
| 2019/0317582 A1 | 10/2019 | Nayak et al. | |
| 2020/0136380 A1 | 4/2020 | Mathew et al. | |

OTHER PUBLICATIONS

International Search Report and Written Opinion—PCT/US2023/037261—ISA/EPO—Mar. 15, 2024.

* cited by examiner

*Primary Examiner* — Jared Fureman
*Assistant Examiner* — Nicolas Bellido
(74) *Attorney, Agent, or Firm* — Haynes and Boone, LLP (57) ABSTRACT

A differential ESD circuit is provided for protecting a pair of differential terminals of an integrated circuit from electrostatic shock. A first diode couples between a first terminal in the pair of differential terminals and a first resistor that couples to a voltage node of the integrated circuit. Similarly, a second diode couples between a second terminal in the pair of differential terminals and a second resistor that couples to the voltage node of the integrated circuit. The first and second resistors isolate the first and second terminals from a capacitive loading that would otherwise exist from the first and second diodes.

21 Claims, 6 Drawing Sheets

FULLY DIFFERENTIAL ESD CIRCUIT FOR HIGH-FREQUENCY APPLICATIONS

TECHNICAL FIELD

This application relates to electrostatic discharge (ESD) circuits, and more particularly to a fully differential ESD circuit for high-frequency applications.

BACKGROUND

High-speed data protocols generally use a differential signaling scheme due to the resulting robustness to common-mode noise. An integrated circuit for such a differential high-speed data protocol will thus have a pair of differential terminals or pins for the differential signaling. For example, a universal serial bus (USB) interface for an integrated circuit includes a data positive (DP) terminal and a data negative (DN) terminal. To receive the differential signaling, such an integrated circuit will typically include a differential pair of transistors. A first one of transistors in the differential pair has a gate coupled to the D+ terminal whereas a second one of the transistors in the differential pair has a gate coupled to the D− terminal. This coupling to the differential pair of transistors results in the differential pair of terminals being especially sensitive to electrostatic damage such as would occur when one of the terminals is grounded while another one of the terminals is exposed to an electrostatic-shock-induced charge. An integrated circuit with a pair of differential terminals will thus typically include a electrostatic discharge (ESD) circuit that couples to the pair of differential terminals. The ESD circuit safely conducts electrostatic-shock-induced charge from the excited terminal to the grounded terminal. But conventional electrostatic discharge circuits typically load the differential terminals with a substantial amount of capacitance.

SUMMARY

In accordance with an aspect of the disclosure, an electrostatic discharge (ESD) circuit is provided that includes: a first integrated circuit terminal; a second integrated circuit terminal; a voltage node; a first resistor having a first terminal coupled to the voltage node; a second resistor having a first terminal coupled to the voltage node; a first ESD diode coupled between the first integrated circuit terminal and a second terminal of the first resistor, a second ESD diode coupled between the second integrated circuit terminal and a second terminal of the second resistor; a first ESD clamp circuit coupled between the second terminal of the first resistor and ground; and a second ESD clamp circuit coupled between the second terminal of the second resistor and ground.

In accordance with another aspect of the disclosure, a method of electrostatic discharge is provided that includes: receiving a first charge at a first terminal of an integrated circuit from a first electrostatic shock; conducting the first charge from the first terminal through a first diode to a power supply node; conducting the first charge from the power supply node through a first RC clamp circuit to a ground node; conducting the first charge from the ground node through a second RC clamp circuit to a first node that is isolated by a first resistor from a negative voltage node for a negative voltage; and conducting the first charge from the first node through a second diode to a second terminal of the integrated circuit to dissipate the first electrostatic shock.

In accordance with yet another aspect of the disclosure, an integrated circuit is provided that includes: a first terminal; a second terminal; a first resistor; a second resistor; a first ESD diode coupled between the first terminal and the first resistor, the first ESD diode being coupled to the first resistor through a first node; a second ESD diode coupled between the second terminal and the second resistor, the second ESD diode being coupled to the second resistor through a second node; a first ESD clamp circuit coupled to the first node; and a second ESD clamp circuit coupled to the second node.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
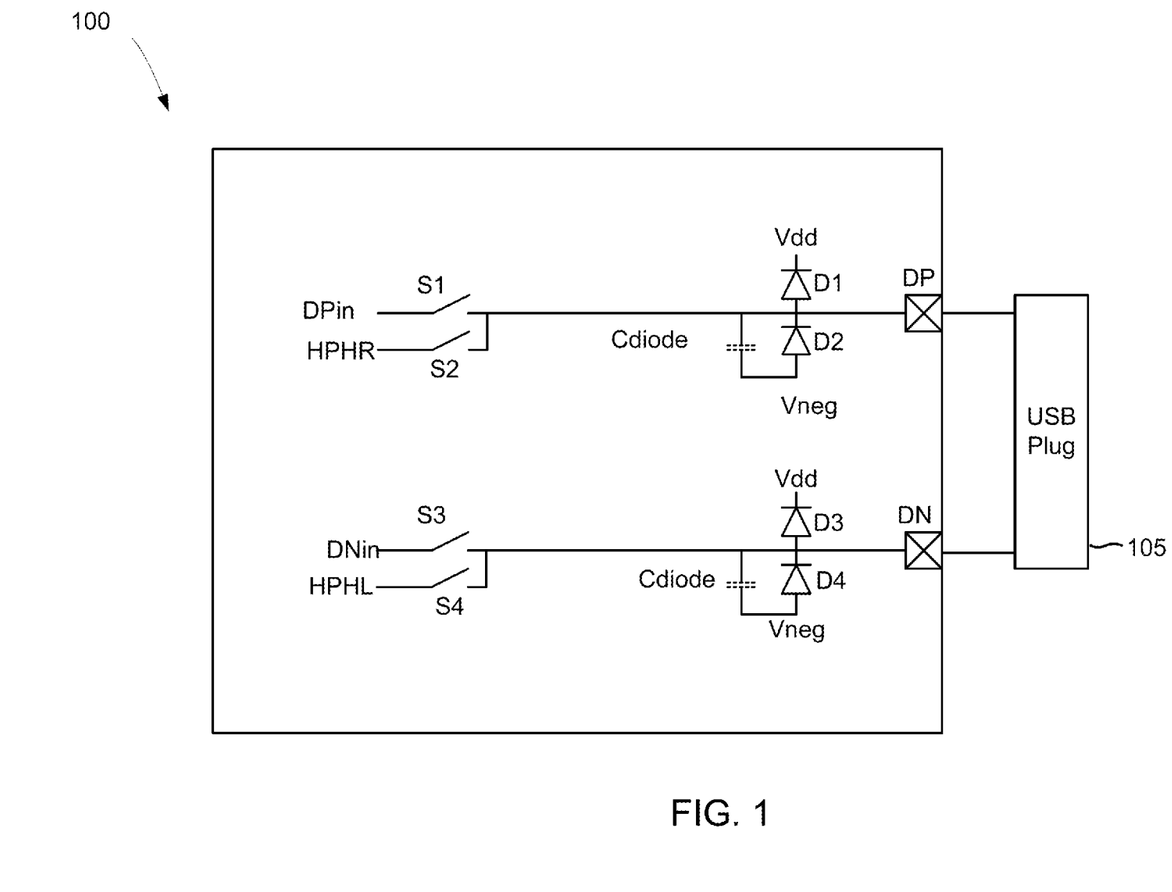
FIG. 1 is a circuit diagram of an integrated circuit that drives both high-speed data and audio data over a pair of differential terminals protected by ESD diodes.

To provide a better appreciation of the capacitive loading from ESD diodes, an example integrated circuit 100 is shown in FIG. 1 that includes a pair of differential terminals formed by a USB data positive (DP) and a data negative (DN) terminal. An ESD diode D1 has an anode coupled to the DP terminal and a cathode coupled to a node for a power supply voltage Vdd. Similarly, an ESD diode D2 has an anode coupled to a node or rail for a negative voltage Vneg and a cathode coupled to the DP terminal. The DN terminal is protected by an analogous pair of ESD diodes D3 and D4. An anode of diode D3 couples to the DN terminal whereas its cathode couples to the power supply node. An anode of diode D4 couples to the negative voltage rail whereas its cathode couples to the DN terminal.

Suppose that the DP terminal is positively charged from an electrostatic shock while the DN terminal is grounded. The charging of the DP terminal forward biases diode D1, which allows the charge to flow from the DP terminal and through diode D1 to the power supply node (which may also be denoted as a positive voltage rail). An ESD clamp circuit such as an RC clamp circuit (not illustrated) couples between the positive and negative voltage rails. As will be explained further herein, an RC clamp circuit is edge triggered such that the sudden charging of the positive voltage rail by the electrostatic discharge causes the RC clamp circuit to conduct so that the charge is passed to the negative voltage rail. This charging of the negative voltage rail causes diode D4 to conduct so that the charge is finally passed to the DN terminal. The same process just described with respect to the ESD discharge from the DP terminal to the DN terminal will also occur should the DN terminal be subjected to a negative charge from an electrostatic shock while the DP terminal is grounded. Conversely, suppose that the DN terminal is positively charged from an electrostatic shock while the DP terminal is grounded. Diode D3 then becomes forward biased to conduct the positive charge from the DN terminal to the positive voltage rail. In turn, the RC clamp circuit conducts to conduct the positive charge from the positive voltage rail to the negative voltage rail. The positive charge on the negative voltage rail forward biases diode D2 so that the positive charge conducts through diode D2 to the DP terminal. A similar process with respect to the ESD discharge from the DN terminal to the DP terminal will also occur should the DP terminal be subjected to a negative charge from an electrostatic shock while the DN terminal is grounded. The combination of diodes D1, D2, D3, D4, and the RC clamp circuit form a differential ESD circuit that protects circuitry within integrated circuit 100 such as a differential pair of transistors as discussed earlier.

The resulting ESD protection of the DP and DN terminals causes issues particularly when the DP and DN terminals are also used for audio signals (e.g., the headphone right (HPHR) signal and the headphone left (HPHL) signal. In that regard, integrated circuit 100 may include a pair of switches S1 and S3 that are closed during a high-speed data mode of operation and a pair of switches S2 and S4 that are closed during an audio mode of operation. During the audio mode of operation, integrated circuit 100 may generate the audio signals HPHR and HPHL (or these signals may be generated in another integrated circuit and coupled into integrated circuit 100). The audio signal HPHR couples through switch S2 and the DP terminal to the external device via a USB plug 105. Similarly, the audio signal HPHL couples through switch S4 and the DN terminal to the external device via USB plug 105. Switches S1 and S3 are open during the audio mode of operation.

During the high-speed data mode of operation, integrated circuit 100 may generate a DP signal (DPin) that couples through switch S1 and the DP terminal to an external device (not illustrated) that couples to the DP and DN terminals through a USB plug 105. Similarly, integrated circuit 100 may generate a DN signal (DNin) that couples through switch S3 and the DN terminal to the external device via USB plug 105. Due to the bidirectionality of the DP and DN terminals, the external device may instead drive the DP and DN terminals such that the DPin and DNin signals are received signals rather than being generated by integrated circuit 100. Switches S2 and S4 are open during the data mode of operation.

Although switches S2 and S4 are open during the data mode of operation, these switches and the associated audio driving circuitry (not illustrated) load the DP and DN terminals with capacitance. This capacitive loading is exacerbated by the capacitive loading from the ESD diodes. For example, diode D2 loads the DP terminal with a parasitic capacitance represented as Cdiode that exists between the DP terminal and the negative voltage rail. Similarly, diode D4 loads the DN terminal with a parasitic capacitance which may be equivalently represented as a capacitance Cdiode between the DNP terminal and the negative voltage rail. Diodes D1 and D3 introduce a similar parasitic capacitance between terminals DP and DN with the positive voltage rail. The resulting parasitic capacitance from the ESD diodes is problematic during the high-speed data mode and can result in an undesirable increased bit error rate.

Although the ESD diodes undesirably load the DP and DN terminals with parasitic capacitance, the DP and DN terminals need ESD protection. To continue to provide ESD protection yet lower the capacitive loading of the differential terminals, an improved differential ESD circuit is provided as follows. This improved differential ESD circuit may be used to protect any suitable pair of differential terminals. Thus, although the following discussion will be directed to USB implementations, it will be appreciated that the improved differential ESD circuit disclosed herein may be used to protect differential terminals in other types of high-speed data protocols besides the USB protocol.

Figure 2:
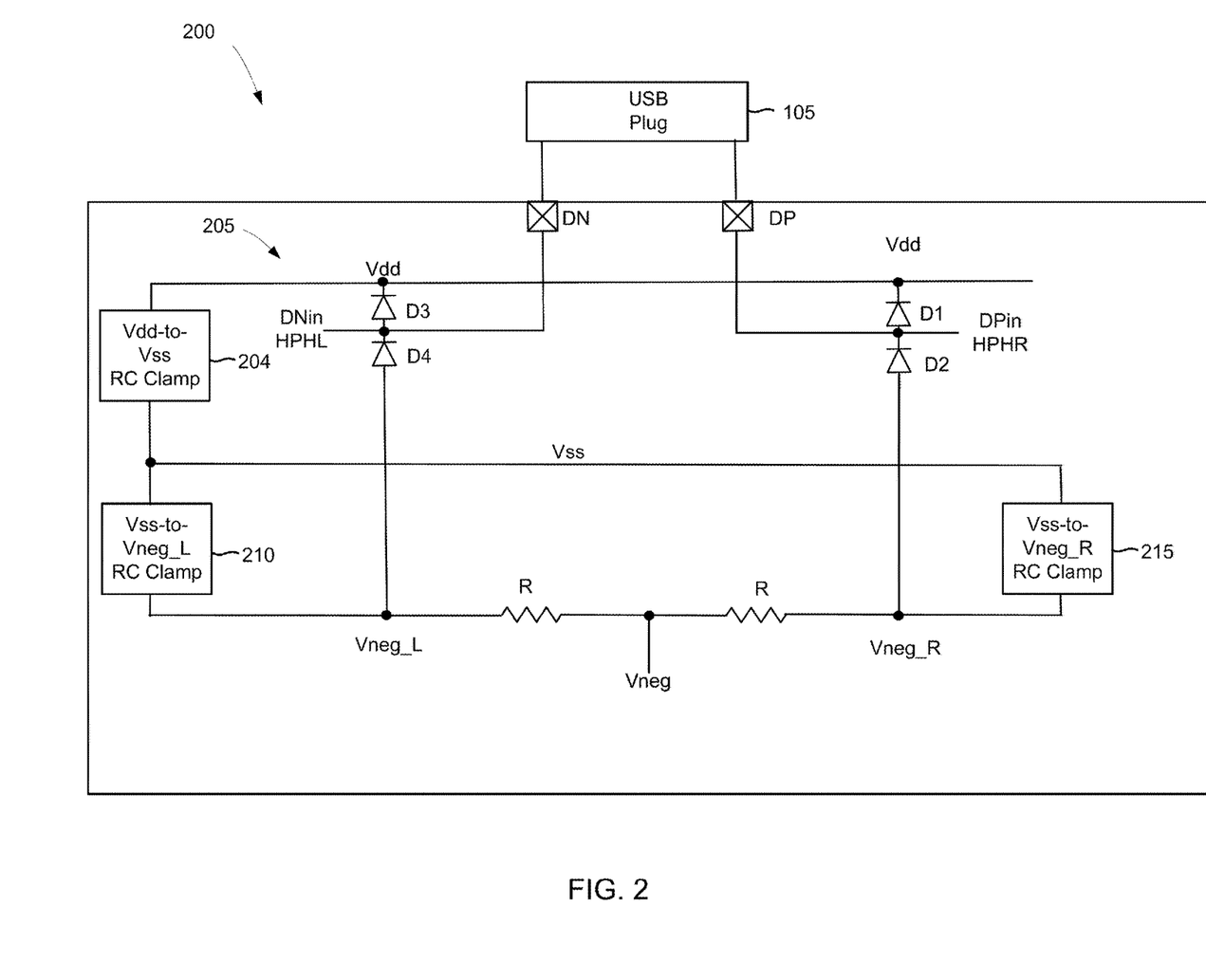
FIG. 2 is a circuit diagram of an integrated circuit with an improved differential ESD circuit in accordance with an aspect of the disclosure.

An example integrated circuit 200 with an improved differential ESD circuit 205 is shown in FIG. 2. As discussed for integrated circuit 100, integrated circuit 200 includes a USB data positive (DP) and a data negative (DP) terminal. The DP terminal may also be denoted herein as a first terminal. Similarly, the DN terminal may also be denoted herein as a second terminal. An external device (not illustrated) couples to the DP and DN terminals through the USB plug 105 analogously as discussed for integrated circuit 100. The ESD diode D1 has an anode coupled to the DP terminal and a cathode coupled to a power supply node for the power supply voltage Vdd as discussed for integrated circuit 100. But the anode of the ESD diode D2 no longer couples directly to the negative voltage rail for the negative voltage Vneg but instead couples to a Vneg_R node that in turn couples to the negative voltage node through a first resistor R. The first resistor R has a first terminal coupled to the negative node and a second terminal coupled to the DP terminal. The Vneg_R node is also denoted herein as a first node. The cathode of diode D2 couples to the DP terminal. The diode D3 functions as in integrated circuit 100 such that its anode couples to the DN terminal whereas its cathode couples to the power supply node. Analogous to diode D2, an anode of diode D4 couples to a Vneg_L node that in turn couples to the negative voltage rail through a second resistor R. The second resistor R has a first terminal coupled to the negative voltage node and a second terminal coupled to the DN terminal. The Vneg_L node is also denoted herein as a second node. The cathode of diode D4 couples to the DN terminal.

First and second resistors R may have a resistance such a 1 KΩ that is readily formed as an on-die resistor on the semiconductor die forming integrated circuit 200. Such a resistance effectively insulates or isolates the parasitic capacitance of diodes D2 and D4 from their respective terminals DP and DN. For example, should the parasitic capacitance of diodes D2 and D4 be approximately 1 pF, the inclusion of resistors R and the Vneg_L and Vneg_R nodes in the differential ESD circuit 205 reduces the capacitive loading of terminal DP by approximately 1 pF and reduces the capacitive loading of terminal DN by approximately 1 pF. Such a substantial reduction of capacitance is advantageous because the terminal DP couples to switches S1 and S2 (not shown in FIG. 2 for illustration clarity but arranged as discussed with regard to integrated circuit 100) so that integrated circuit 200 may drive terminal DP in a high-speed data mode or in an audio mode. Similarly, terminal DN couples to switches S3 and S4 (not shown in FIG. 2 for illustration clarity but arranged as discussed with regard to integrated circuit 100) so that integrated circuit 200 may drive terminal DN in the high-speed data mode or in the audio mode. Without the advantageous reduction of capacitive loading by ESD circuit 205, integrated circuit 200 may suffer from an undesirably high bit error rate during the high-speed data mode as discussed analogously with regard to integrated circuit 100.

To provide a differential electrostatic discharge despite the presence of resistors R, differential ESD circuit 205 includes a Vdd-to-Vss RC clamp circuit 204 that couples between the power supply node and ground. In addition, differential ESD circuit 205 includes a Vss-to-Vneg_L RC clamp circuit 210 that couples between ground and the Vneg_L node. Differential ESD circuit also includes a VSS-to-Vneg_R RC clamp circuit 215 that couples between ground and the Vneg_R node. RC clamp circuit 215 is also denoted herein as a first ESD clamp circuit. Similarly, RC clamp circuit 210 is also denoted herein as a second ESD clamp circuit. An example implementation for the various RC clamp circuits disclosed herein will be discussed below. The ground node is an example of a first voltage node as defined herein. Similarly, the negative voltage rail is an example of a second voltage node as defined herein. The functioning of ESD circuit 205 to protect integrated circuit 200 from electrostatic shock will now be discussed.

Suppose that the DP terminal is positively charged from an electrostatic shock while the DN terminal is grounded. The charging of the DP terminal forward biases diode D1, which allows the charge to flow from the DP terminal and through diode D1 to the power supply node (which may also be denoted as a positive voltage rail). This sudden charging of the positive voltage rail by the electrostatic shock causes the Vdd-to-Vss RC clamp circuit 204 to conduct so that the charge is passed to the ground node. This charging of the ground node or rail causes the Vss-to-Vneg_L RC clamp circuit 210 to conduct so that the charge is finally passed to the Vneg_L node. The charging of the Vneg_L node causes diode D4 to become forward biased so that the electrostatic discharge conducts from terminal DP through ESD circuit 205 to terminal DN to safely dissipate the electrostatic shock. ESD circuit 205 will also function analogously as just described should the DN terminal be subjected to a negative charge from an electrostatic shock while the DP terminal is grounded.

Conversely, suppose that the DN terminal is positively charged from an electrostatic shock while the DP terminal is grounded. Diode D3 then becomes forward biased to conduct the positive charge from the DN terminal to the positive voltage rail. In turn, the Vdd-to-Vss RC clamp circuit 204 conducts to conduct the positive charge from the positive voltage rail to the ground node. The positive charge on the ground node causes the Vss-to-Vneg_R RC clamp circuit 215 to conduct to pass the charge to the Vneg_R node. The charge on the Vneg_R node then forward biases diode D2 so that so that the electrostatic discharge conducts from terminal DN through ESD circuit 205 to terminal DP to safely dissipate the electrostatic shock. A similar process will also occur should the DP terminal be subjected to a negative charge from an electrostatic shock while the DN terminal is grounded.

Figure 3:
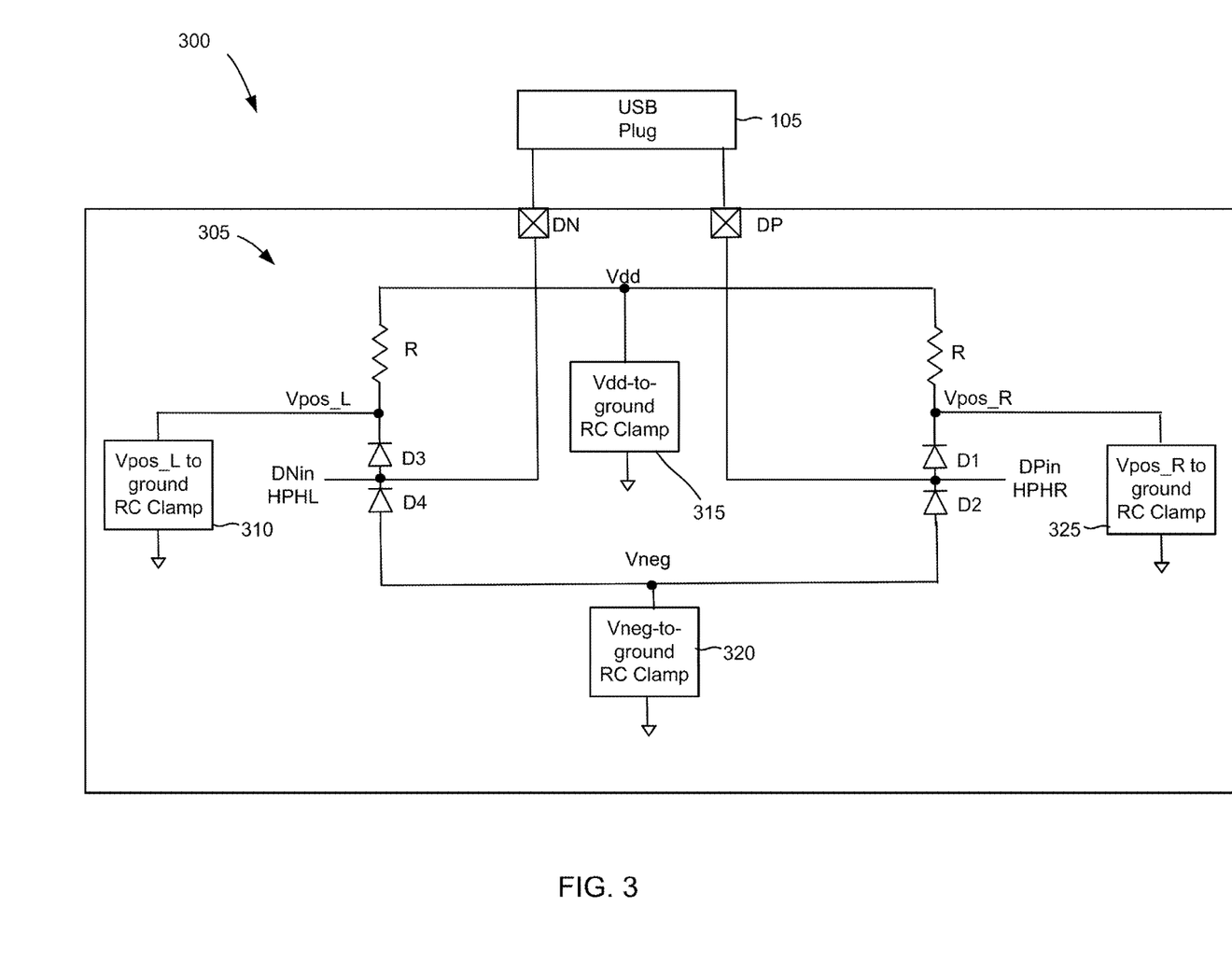
FIG. 3 is a circuit diagram of an integrated circuit with an improved differential ESD circuit in accordance with an aspect of the disclosure.

Note that an improved ESD circuit may also be implemented analogously as discussed for ESD circuit 205 to isolate the parasitic capacitance of diodes D1 and D3 from their respective terminals DP and DN. An example integrated circuit 300 with such an improved differential ESD circuit 305 is shown in FIG. 3. As discussed for integrated circuit 200, integrated circuit 300 includes a USB data positive (DP) and a data negative (DN) terminal. An external device (not illustrated) couples to the DP and DN terminals through the USB plug 105 analogously as discussed for integrated circuit 100. The cathode of the ESD diode D1 in ESD circuit 305 no longer directly couples to the power supply node but instead couples to a Vpos_R node that in turn couples to the power supply node through a first resistor R. The first resistor R has a first terminal coupled to the power supply node and a second terminal coupled to the DP terminal. Analogous to diode D1, the cathode of the diode D3 couples to a Vpos_L node that in turn couples to the power supply node through a second resistor R. The second resistor R has a first terminal coupled to the power supply node and a second terminal coupled to the DN terminal. The anode of diode D3 couples to the DN terminal. Diodes D4 and D2 are arranged as discussed for integrated circuit 100. The Vpos_R node is another example of a first node. Similarly, the Vpos_L node is another example of a second node.

The first and second resistors R in ESD circuit 305 may have a resistance such as 1 KΩ as discussed for ESD circuit 205. Such a resistance effectively insulates or isolates the parasitic capacitance of diodes D1 and D3 from their respective terminals DP and DN. For example, should the parasitic capacitance of diodes D1 and D3 be approximately 1 pF, the inclusion of resistors R and the Vpos_L and Vpos_R nodes in the differential ESD circuit 305 reduces the capacitive loading of terminal DP by approximately 1 pF and reduces the capacitive loading of terminal DN by approximately 1 pF. Such a substantial reduction of capacitance is advantageous because the terminal DP couples to switches S1 and S2 (not shown in FIG. 3 for illustration clarity but arranged as discussed with regard to integrated circuit 100) so that integrated circuit 300 may drive terminal DP in the high-speed data mode or in the audio mode. Similarly, terminal DN couples to switches S3 and S4 (not shown in FIG. 3 for illustration clarity but arranged as discussed with regard to integrated circuit 100) so that integrated circuit 300 may drive terminal DN in the high-speed data mode or in the audio mode. Without the advantageous reduction of capacitive loading by ESD circuit 305, integrated circuit 300 may suffer from an undesirably high bit error rate during the high-speed data mode as discussed analogously with regard to integrated circuit 100.

To provide a differential electrostatic discharge despite the presence of the first and second resistors R, differential ESD circuit 305 includes a Vdd-to-ground RC clamp circuit 315 that couples between the power supply node and ground. In addition, differential ESD circuit 305 includes a Vpos_L-to-ground RC clamp circuit 310 that couples between the Vpos_L node and ground. Differential ESD circuit 305 also includes a Vpos_R-to-ground RC clamp circuit 325 that couples between the Vpos_R node and ground. The Vpos_R-to-ground RC clamp circuit 325 is also denoted herein as a first ESD clamp circuit whereas the Vpos_L-to-ground RC clamp circuit 310 is also denoted herein as a second ESD clamp circuit. In addition, a Vneg-to-ground RC clamp circuit 320 couples between ground and the negative voltage node for the negative voltage Vneg. The Vdd-to-ground RC clamp circuit 315 is also denoted herein as a third ESD clamp circuit whereas the Vneg-to-ground RC clamp circuit 320 is also denoted herein as a fourth ESD clamp circuit. The functioning of ESD circuit 305 to protect integrated circuit 300 from electrostatic shock will now be discussed.

Suppose that the DP terminal is positively charged from an electrostatic shock while the DN terminal is grounded. The charging of the DP terminal forward biases diode D1, which allows the charge to flow from the DP terminal and through diode D1 to the Vpos_R node. This sudden charging of the Vpos_R node by the electrostatic shock causes the Vpos_R-to-ground RC clamp circuit 325 to conduct so that the charge is passed to ground. This charging of the ground node causes the Vneg-to-ground RC clamp circuit 320 to conduct so that the charge is finally passed to the Vneg node. The charging of the Vneg node causes diode D4 to become forward biased so that the electrostatic discharge conducts from terminal DP through ESD circuit 305 to terminal DN to safely dissipate the electrostatic shock. ESD circuit 305 will also function analogously as just described should the DN terminal be subjected to a negative charge from an electrostatic shock while the DP terminal is grounded.

Conversely, suppose that the DN terminal is positively charged from an electrostatic shock while the DP terminal is grounded. Diode D3 then becomes forward biased to conduct the positive charge to the Vpos_L node. In turn, the Vpos_L-to-ground RC clamp circuit 310 conducts the positive charge from the Vpos_L node to ground. The sudden charging of the ground node causes the Vneg-to-ground RC clamp circuit 320 to conduct to pass the charge to the negative voltage node. The charge on the negative voltage node then forward biases diode D2 so that so that the charge conducts from terminal DN through ESD circuit 305 to terminal DP to safely dissipate the electrostatic shock. A similar process will also occur should the DP terminal be subjected to a negative charge from an electrostatic shock while the DN terminal is grounded. It will be appreciated that the isolation of the capacitive loading from diodes D4 and D2 as discussed with regard to ESD circuit 205 may be combined in alternative implementations with the isolation of the capacitive loading from diodes D1 and D2 as discussed with regard to ESD circuit 305.

Figure 4:
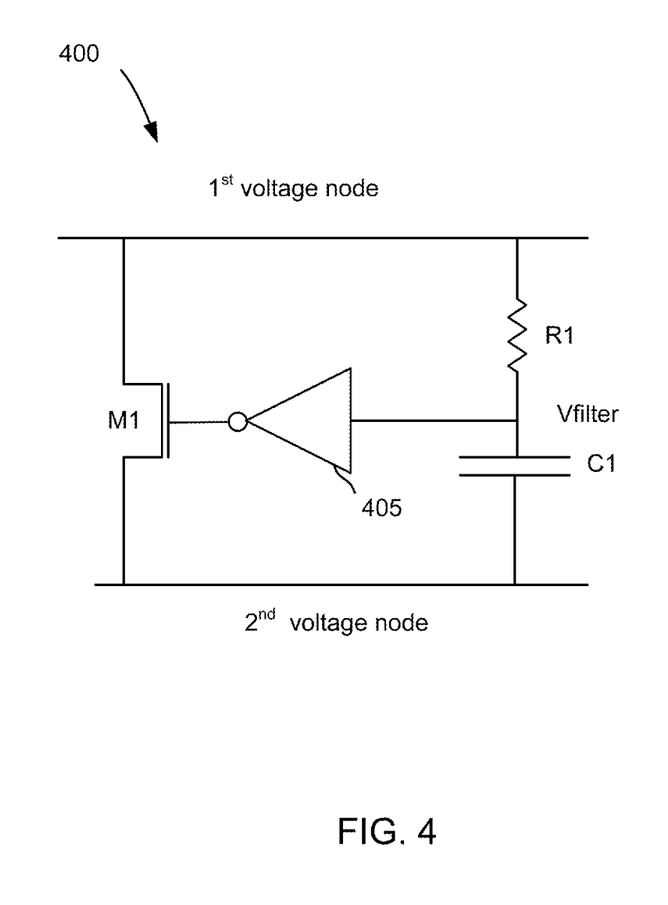
FIG. 4 is a circuit diagram of an example ESD clamp circuit in accordance with an aspect of the disclosure.

The various RC clamp circuits disclosed herein may be also denoted as edge-triggered RC clamp circuits as they function to conduct in response to the edge triggering of the electrostatic shock. There are assorted implementations for a suitable RC clamp circuit. A simplified version of an RC clamp circuit 400 is shown in FIG. 4. The RC clamp circuit 400 includes an n-type metal-oxide-semiconductor (NMOS) transistor having its drain coupled to a first voltage node and a source coupled to a second voltage node. An RC time constant of the RC clamp circuit 400 is established by a resistor R1 and a capacitor C1 that couple in series between the first and second voltage nodes. An inverter 405 inverts a voltage Vfilter of a node between the resistor R1 and the capacitor C1 to drive a gate of the transistor M1. More generally, inverter 405 represents a serial chain of an odd number of inverters (for example, three inverters) so that a sufficient time delay occurs from the electrostatic-shock-triggered charging of the Vfilter voltage and the switching on of the transistor M1.

Figure 5:
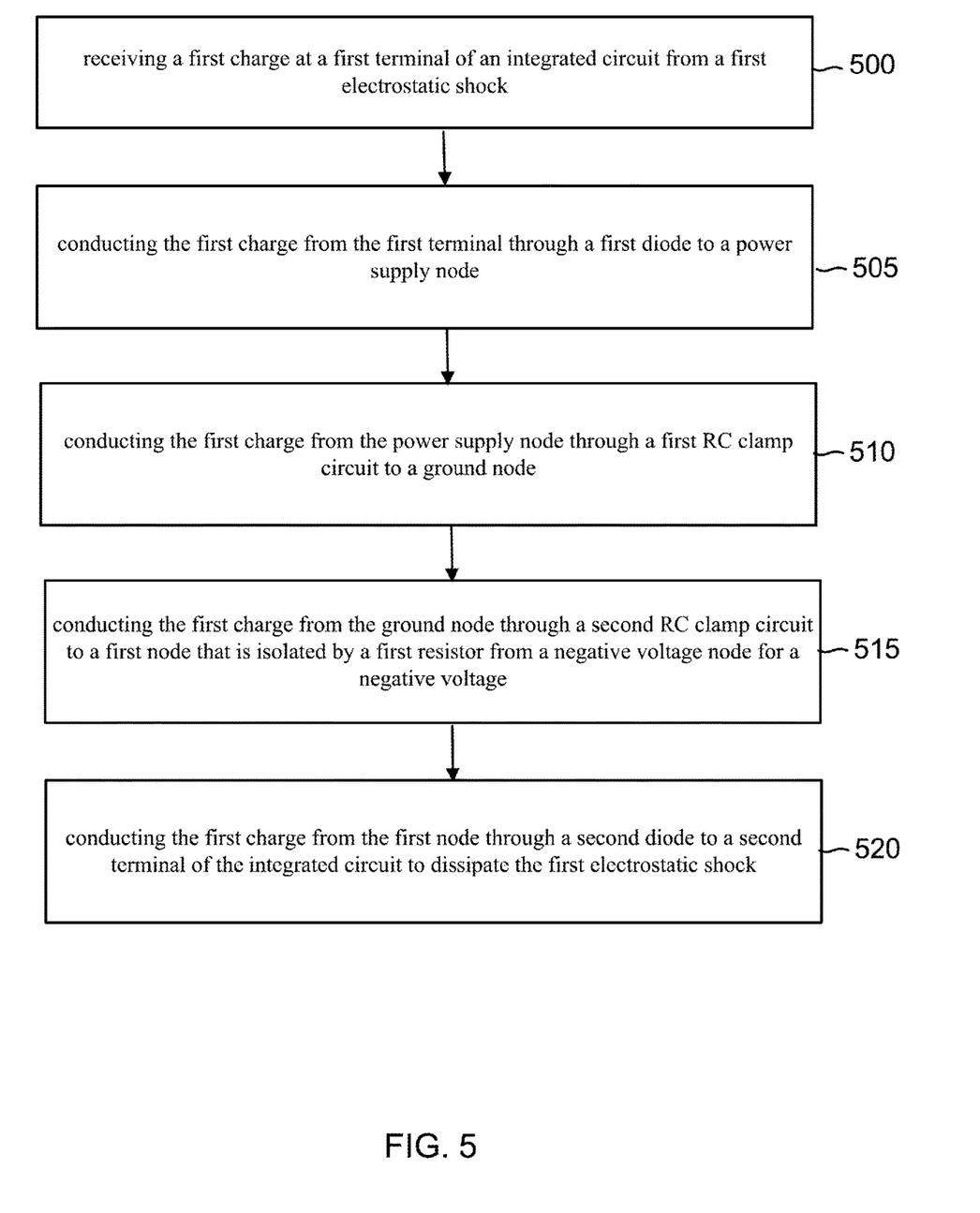
FIG. 5 is a flowchart for a method of operation for a differential ESD circuit in accordance with an aspect of the disclosure.

A method of operation for an ESD discharge circuit will now be discussed with regard to the flowchart shown in FIG. 5. The method includes an act 500 of receiving a first charge at a first terminal of an integrated circuit from a first electrostatic shock. The charging of terminals DP or DN in ESD circuits 205 or 305 is an example of act 500. The method also includes an act 505 of conducting the first charge from the first terminal through a first diode to a power supply node. The conducting through either of diodes D1 or D3 in ESD circuit 205 is an example of act 505. The method further includes an act 510 of conducting the first charge from the power supply node through a first RC clamp circuit to a ground node. The conducting through RC clamp circuit 204 in ESD circuit 205 is an example of act 510. The method also includes an act 515 of conducting the first charge from the ground node through a second RC clamp circuit to a first node that is isolated by a first resistor from a negative voltage node for a negative voltage. The conducting through either of the RC clamp circuits 210 and 215 in ESD circuit 205 is an example of act 515. Finally, the method includes an act 520 of conducting the first charge from the first node through a second diode to a second terminal of the integrated circuit to dissipate the first electrostatic shock. The conducting through either of diodes D4 or D2 in ESD circuit 205 is an example of act 520.

Figure 6:
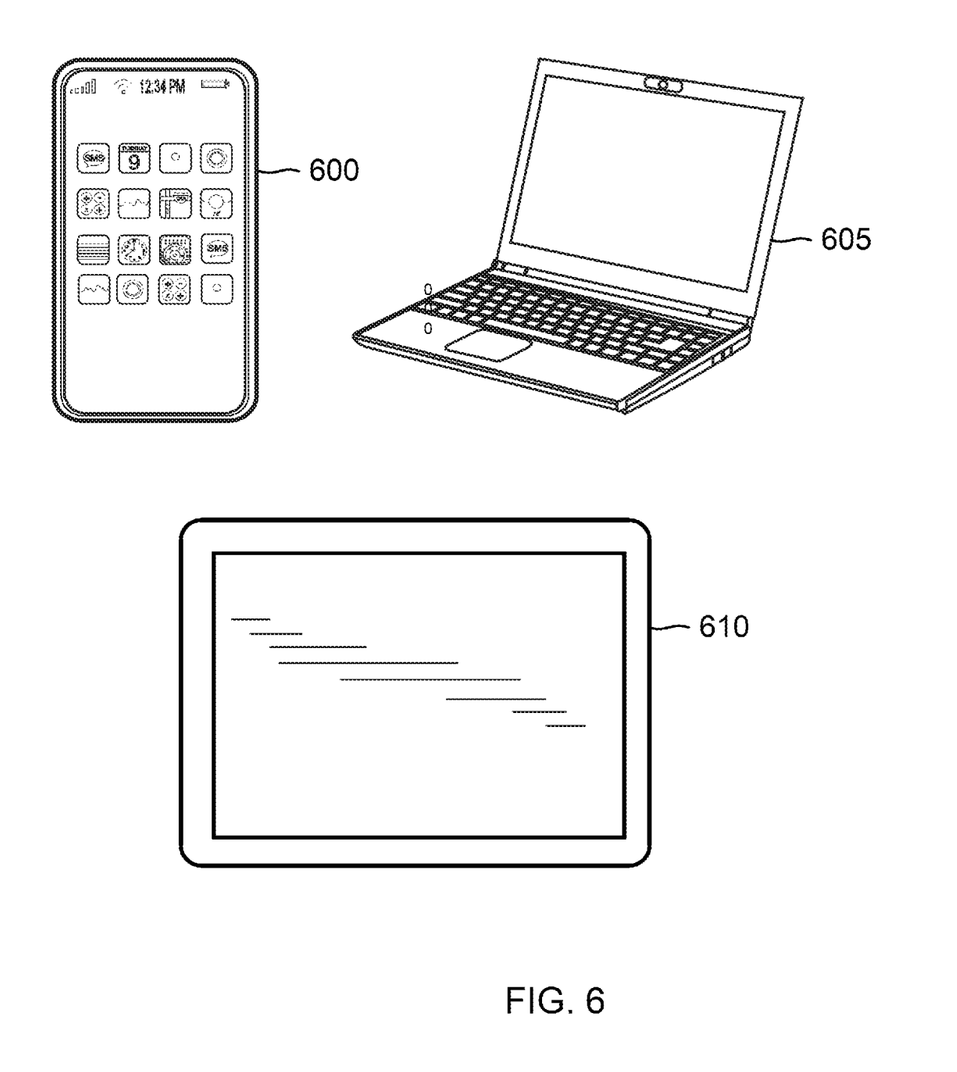
FIG. 6 illustrates some example electronic systems including a differential ESD circuit in accordance with an aspect of the disclosure.

A differential ESD circuit as disclosed herein may be incorporated in any suitable mobile device or electronic system. For example, as shown in FIG. 6, a cellular telephone 600, a laptop computer 605, and a tablet PC 610 may all include a differential ESD circuit in accordance with the disclosure. Other exemplary electronic systems such as a music player, a video player, a communication device, and a personal computer may also be configured with a differential ESD circuit constructed in accordance with the disclosure.

The disclosure will now be summarized in the following series of clauses:

Clause 1. An electrostatic discharge (ESD) circuit, comprising:
- a first integrated circuit terminal;
- a second integrated circuit terminal;
- a voltage node;
- a first resistor having a first terminal coupled to the voltage node;
- a second resistor having a first terminal coupled to the voltage node;
- a first ESD diode coupled between the first integrated circuit terminal and a second terminal of the first resistor,
- a second ESD diode coupled between the second integrated circuit terminal and a second terminal of the second resistor;
- a first ESD clamp circuit coupled between the second terminal of the first resistor and ground; and
- a second ESD clamp circuit coupled between the second terminal of the second resistor and ground.

Clause 2. The electrostatic discharge circuit of clause 1, wherein the first integrated circuit terminal is a positive data terminal of a universal serial bus interface, and wherein the second integrated circuit terminal is a negative data terminal of the universal serial bus interface.

Clause 3. The electrostatic discharge circuit of clause 2, wherein the universal serial bus interface is a type-C universal serial bus interface.

Clause 4. The electrostatic discharge circuit of clause 3, wherein the first integrated circuit terminal is also a first audio terminal of the type-C universal serial bus interface, and wherein the second integrated circuit terminal is a second audio terminal of the type-C universal serial bus interface.

Clause 5. The electrostatic discharge circuit of any of clauses 1-4, wherein the voltage node is a negative voltage node.

Clause 6. The electrostatic discharge circuit of clause 5, further comprising: a power supply node for a power supply voltage; and a third ESD clamp circuit coupled between the power supply node and ground.

Clause 7. The electrostatic discharge circuit of clause 6, further comprising:
- a third ESD diode having an anode coupled to the first integrated circuit terminal and a cathode coupled to the power supply node; and a fourth ESD diode having an anode coupled to the second integrated circuit terminal and a cathode coupled to the power supply node.

Clause 8. The electrostatic discharge circuit of clause 6, wherein the first ESD clamp circuit, the second ESD clamp circuit, and the third ESD clamp circuit each comprises an edge-triggered RC clamp circuit.

Clause 9. The electrostatic discharge circuit of clause 1, wherein the voltage node comprises a power supply node for a power supply voltage.

Clause 10. The electrostatic discharge circuit of clause 9, further comprising:
a negative voltage node for a negative voltage;
a third ESD clamp circuit coupled between the power supply node and ground; and
a fourth ESD clamp circuit coupled between the negative voltage node and ground.

Clause 11. The electrostatic discharge circuit of clause 10, further comprising:
a third ESD diode having an anode coupled to the negative voltage node and a cathode coupled to the first integrated circuit terminal; and
a fourth ESD diode having an anode coupled to the negative voltage node and a cathode coupled to the second integrated circuit terminal.

Clause 12. The electrostatic discharge circuit of claim 1, wherein the electrostatic discharge circuit is integrated into an integrated circuit included within a cellular telephone.

Clause 13. The electrostatic discharge circuit of any of clauses 1-12, wherein the first resistor and the second resistor each has a resistance of approximately 1000Ω.

Clause 14. A method of electrostatic discharge, comprising;
receiving a first charge at a first terminal of an integrated circuit from a first electrostatic shock;
conducting the first charge from the first terminal through a first diode to a power supply node;
conducting the first charge from the power supply node through a first RC clamp circuit to a ground node;
conducting the first charge from the ground node through a second RC clamp circuit to a first node that is isolated by a first resistor from a negative voltage node for a negative voltage; and
conducting the first charge from the first node through a second diode to a second terminal of the integrated circuit to dissipate the first electrostatic shock.

Clause 15. The method of clause 14, wherein the first charge is a positive charge.

Clause 16. The method of any of clauses 14-5, further comprising:
receiving a second charge at the second terminal from a second electrostatic shock;
conducting the second charge from the second terminal through a third diode to the power supply node;
conducting the second charge from the power supply node through the first RC clamp circuit to the ground node;
conducting the second charge from the ground node through a third RC clamp circuit to a second node that is isolated by a second resistor from the negative voltage node; and
conducting the second charge from the second node through a fourth diode to the first terminal of the integrated circuit to dissipate the second electrostatic shock.

Clause 17. An integrated circuit, comprising:
a first terminal;
a second terminal;
a first resistor;
a second resistor;
a first ESD diode coupled between the first terminal and the first resistor, the first ESD diode being coupled to the first resistor through a first node;
a second ESD diode coupled between the second terminal and the second resistor, the second ESD diode being coupled to the second resistor through a second node;
a first ESD clamp circuit coupled to the first node; and
a second ESD clamp circuit coupled to the second node.

Clause 18. The integrated circuit of clause 17, wherein the first ESD clamp circuit is coupled between the first node and a ground node, and wherein the second ESD clamp circuit is coupled between the second node and the ground node.

Clause 19. The integrated circuit of clause 17, wherein the first terminal is a positive data terminal of a universal serial bus interface, and wherein the second terminal is a negative data terminal of the universal serial bus interface.

Clause 20. The integrated circuit of clause 17, wherein the first resistor and the second resistor both couple to a power supply node for a power supply voltage.

Clause 21. The integrated circuit of clause 17, wherein the first resistor and the second resistor both couple to a negative voltage node for a negative voltage.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:
1. An electrostatic discharge (ESD) circuit, comprising:
a first integrated circuit terminal;
a second integrated circuit terminal;
a voltage node;
a first resistor having a first terminal coupled to the voltage node;
a second resistor having a first terminal coupled to the voltage node;
a first ESD diode coupled between the first integrated circuit terminal and a second terminal of the first resistor,
a second ESD diode coupled between the second integrated circuit terminal and a second terminal of the second resistor;
a first ESD clamp circuit coupled between the second terminal of the first resistor and ground; and
a second ESD clamp circuit coupled between the second terminal of the second resistor and ground.

2. The electrostatic discharge circuit of claim 1, wherein the first integrated circuit terminal is a positive data terminal of a universal serial bus interface, and wherein the second integrated circuit terminal is a negative data terminal of the universal serial bus interface.

3. The electrostatic discharge circuit of claim 2, wherein the universal serial bus interface is a type-C universal serial bus interface.

4. The electrostatic discharge circuit of claim 3, wherein the first integrated circuit terminal is also a first audio terminal of the type-C universal serial bus interface, and wherein the second integrated circuit terminal is a second audio terminal of the type-C universal serial bus interface.

5. The electrostatic discharge circuit of claim 1, wherein the voltage node is a negative voltage node.

6. The electrostatic discharge circuit of claim 5, further comprising:
a power supply node for a power supply voltage; and
a third ESD clamp circuit coupled between the power supply node and ground.

7. The electrostatic discharge circuit of claim 6, further comprising:
a third ESD diode having an anode coupled to the first integrated circuit terminal and a cathode coupled to the power supply node; and
a fourth ESD diode having an anode coupled to the second integrated circuit terminal and a cathode coupled to the power supply node.

8. The electrostatic discharge circuit of claim 6, wherein the first ESD clamp circuit, the second ESD clamp circuit, and the third ESD clamp circuit each comprises an edge-triggered RC clamp circuit.

9. The electrostatic discharge circuit of claim 1, wherein the voltage node comprises a power supply node for a power supply voltage.

10. The electrostatic discharge circuit of claim 9, further comprising:
a negative voltage node for a negative voltage;
a third ESD clamp circuit coupled between the power supply node and ground; and
a fourth ESD clamp circuit coupled between the negative voltage node and ground.

11. The electrostatic discharge circuit of claim 10, further comprising:
a third ESD diode having an anode coupled to the negative voltage node and a cathode coupled to the first integrated circuit terminal; and
a fourth ESD diode having an anode coupled to the negative voltage node and a cathode coupled to the second integrated circuit terminal.

12. The electrostatic discharge circuit of claim 1, wherein the electrostatic discharge circuit is integrated into an integrated circuit included within a cellular telephone.

13. The electrostatic discharge circuit of claim 1, wherein the first resistor and the second resistor each has a resistance of approximately 1000Ω.

14. A method of electrostatic discharge, comprising:
receiving a first charge at a first terminal of an integrated circuit from a first electrostatic shock;
conducting the first charge from the first terminal through a first diode to a power supply node;
conducting the first charge from the power supply node through a first RC clamp circuit to a ground node;
conducting the first charge from the ground node through a second RC clamp circuit to a first node that is isolated by a first resistor from a negative voltage node for a negative voltage; and
conducting the first charge from the first node through a second diode to a second terminal of the integrated circuit to dissipate the first electrostatic shock.

15. The method of claim 14, wherein the first charge is a positive charge.

16. The method of claim 14, further comprising:
receiving a second charge at the second terminal from a second electrostatic shock;
conducting the second charge from the second terminal through a third diode to the power supply node;
conducting the second charge from the power supply node through the first RC clamp circuit to the ground node;
conducting the second charge from the ground node through a third RC clamp circuit to a second node that is isolated by a second resistor from the negative voltage node; and
conducting the second charge from the second node through a fourth diode to the first terminal of the integrated circuit to dissipate the second electrostatic shock.

17. An integrated circuit, comprising:
a first terminal;
a second terminal;
a first resistor;
a second resistor;
a first ESD diode coupled between the first terminal and the first resistor, the first ESD diode being coupled to the first resistor through a first node;
a second ESD diode coupled between the second terminal and the second resistor, the second ESD diode being coupled to the second resistor through a second node;
a first ESD clamp circuit coupled to the first node; and
a second ESD clamp circuit coupled to the second node.

18. The integrated circuit of claim 17, wherein the first ESD clamp circuit is coupled between the first node and a ground node, and wherein the second ESD clamp circuit is coupled between the second node and the ground node.

19. The integrated circuit of claim 17, wherein the first terminal is a positive data terminal of a universal serial bus interface, and wherein the second terminal is a negative data terminal of the universal serial bus interface.

20. The integrated circuit of claim 17, wherein the first resistor and the second resistor are both coupled to a power supply node for a power supply voltage.

21. The integrated circuit of claim 17, wherein the first resistor and the second resistor are both coupled to a negative voltage node for a negative voltage.

* * * * *